United States Patent
Chang

(10) Patent No.: US 8,242,507 B2
(45) Date of Patent: Aug. 14, 2012

(54) PIXEL STRUCTURE HAVING CAPACITOR COMPENSATION

(75) Inventor: Hsi-Ming Chang, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 361 days.

(21) Appl. No.: 12/626,689

(22) Filed: Nov. 27, 2009

(65) Prior Publication Data

US 2011/0079781 A1    Apr. 7, 2011

(30) Foreign Application Priority Data

Oct. 1, 2009    (TW) .............................. 98133375 A

(51) Int. Cl.
*H01L 27/14* (2006.01)
*H01L 29/04* (2006.01)
*H01L 29/15* (2006.01)
*H01L 31/036* (2006.01)

(52) U.S. Cl. ............ 257/72; 257/59; 257/249; 257/401; 349/42

(58) Field of Classification Search ............ 257/72, 257/59, 249, 401, 225, 459, 331; 349/42
See application file for complete search history.

(56) References Cited

U.S. PATENT DOCUMENTS

| | | | |
|---|---|---|---|
| 5,741,716 A * | 4/1998 | Choi et al. | 438/158 |
| 5,808,317 A * | 9/1998 | Kuo | 257/66 |
| 6,310,668 B1 * | 10/2001 | Ukita | 349/42 |
| 6,320,221 B1 * | 11/2001 | Choi et al. | 257/330 |
| 6,664,569 B2 * | 12/2003 | Moon | 257/72 |
| 6,930,743 B2 * | 8/2005 | Park et al. | 349/149 |
| 7,060,540 B2 * | 6/2006 | Hung | 438/149 |
| 7,345,717 B2 | 3/2008 | Lai | |
| 7,427,777 B2 | 9/2008 | Tsou | |
| 7,688,392 B2 * | 3/2010 | Wang et al. | 349/46 |
| 7,829,895 B2 * | 11/2010 | Tsou | 257/72 |
| 7,910,926 B2 * | 3/2011 | Ishii | 257/59 |
| 7,932,962 B2 * | 4/2011 | Yeh et al. | 349/39 |
| 8,089,574 B2 * | 1/2012 | Tsubata et al. | 349/43 |
| 2001/0050368 A1 * | 12/2001 | Moon | 257/72 |
| 2004/0080681 A1 * | 4/2004 | Moon | 349/43 |
| 2004/0135164 A1 * | 7/2004 | Park et al. | 257/99 |

* cited by examiner

*Primary Examiner* — Telly Green
(74) *Attorney, Agent, or Firm* — Winston Hsu; Scott Margo

(57) ABSTRACT

A pixel structure having capacitor compensation includes a thin-film transistor, and the thin-film transistor includes a source electrode, a drain electrode, a semiconductor layer and a gate electrode. The gate electrode includes a bar-shaped main part, and at least a protrusion part or two indention parts. One of the characteristics of the present invention lies in layout patterns of the drain electrode and gate electrode. An overlapping area between the drain electrode and gate electrode, and the position of the overlapping area can both be kept by virtue of the arrangement of the protrusion part or the indention parts of the gate electrode, even when the alignment between the drain electrode and gate electrode is changed. Therefore, the gate-drain capacitor (Cgd) will not be changed so that the quality of the liquid crystal display will be improved accordingly.

14 Claims, 9 Drawing Sheets

PIXEL STRUCTURE HAVING CAPACITOR COMPENSATION

BACKGROUND OF THE INVENTION

1. Field of the Invention

The present invention relates to a pixel structure, and more particularly, to a layout of thin film transistors (TFTs) of a pixel structure.

2. Description of the Prior Art

FIG. 1 is a regional schematic diagram of a conventional pixel structure. As shown in FIG. 1, the conventional pixel structure 120 mainly includes a TFT 122, a pixel electrode 124, a scan line 126, and a data line 128. The TFT 122 is electrically connected to the pixel electrode 124. Specifically, the TFT 122 includes a gate electrode 122a, a channel region 122b, a source electrode 122c, and a drain electrode 122d. The TFT 122 is bottom gate TFT, and the drain electrode 122d of the TFT 122 is electrically connected to the pixel electrode 124. The scan line 126 provides a voltage to the gate electrode 122a, and the data line 128 provides a voltage to the TFT 122 and further transmits the voltage to the pixel electrode 124 via the TFT 122 to offer a potential difference to the liquid crystal layer.

An area where the gate electrode 122a and the drain electrode 122d overlap with each other forms a gate-drain capacitor (Cgd) 10. The capacitance of the gate-drain capacitor 10 is directly proportional to the size of the overlapping area. Generally, factors such as errors in mask alignment or machinery vibration may cause the layout of the drain electrode 122d to be misaligned all around the front, back, left, and right directions when manufacturing a TFT. As a result, the area where the gate electrode 122a and the drain electrode 122d overlap with each other in a vertical direction may change accordingly, which further causes an alteration in the capacitance of the gate-drain capacitor 10. As the capacitance level of the gate-drain capacitor 10 changes, the pixel feed-through voltage will change as well, which may affect the TFT display quality. For example, as TFTs are applied to control pixel arrays of a display device, capacitance fluctuation could result in uneven brightness in different pixels at the same desired grey scale, and thus, the display brightness control could become inferior to expectation.

Therefore, it is desired to improve the TFT layout in order to solve the display quality problems resulted from capacitance fluctuation.

SUMMARY OF THE INVENTION

In view of the foregoing drawbacks in the prior art, the present invention provides a TFT in which the overlapping area between a gate electrode and a drain electrode can be unaltered with respect to the alignment deviation between the gate electrode and the drain electrode masks without requiring to modifying the exposure procedure or without restricting the process of forming a TFT. Consequently, the present invention is able to ensure the TFT array performance In accordance with an embodiment of the present invention, a pixel structure having capacitor compensation is provided. The pixel structure includes a TFT, which contains a source electrode, a drain electrode, a semiconductor layer, and a gate electrode. The source electrode contains a first electrode bar while the drain electrode contains a second electrode bar, wherein the second electrode bar is substantially parallel to the first electrode bar. The semiconductor layer is disposed under the source electrode and the drain electrode, and the semiconductor layer includes a channel region, which is disposed between the first electrode bar and the second electrode bar. The gate electrode is disposed under the semiconductor layer, and the gate electrode has a bar-shaped main part and at least a protrusion part or at least two indention parts, wherein the bar-shaped main part is parallel to the first electrode bar and the second electrode bar, and the bar-shaped main part is covered by the channel region. In addition, via the protrusion part or the indention parts, the second electrode bar is disposed over the gate electrode and partially overlaps with the gate electrode and two ends of the second electrode bar do not overlap with the gate electrode in a vertical direction. An area where the second electrode bar and the gate electrode overlap with each other forms a capacitor.

According to another embodiment of the present invention, a pixel structure having capacitor compensation is provided. The pixel structure includes a TFT that contains a source electrode, a drain electrode, a semiconductor layer, and a gate electrode. The source electrode contains a first electrode bar while the drain electrode contains a second electrode bar, wherein the second electrode bar is substantially parallel to the first electrode bar. The semiconductor layer is disposed under the source electrode and the drain electrode, and the semiconductor layer contains a channel region, which is disposed between the first electrode bar and the second electrode bar. The gate electrode is disposed under the semiconductor layer, which has a bar-shaped main part and at least one indention part. The bar-shaped main part is parallel to the first electrode bar and the second electrode bar, and the entire channel region covers the bar-shaped main part of the gate electrode. Moreover, the second electrode bar is disposed over the indention part, and two ends of the second electrode bar both overlap with the gate electrode in a vertical direction. An area where the second electrode bar and the gate electrode overlap with each other forms a capacitor.

Therefore, even if the layout between the gate electrode and the drain electrode masks is misaligned all around the front, back, left, and right directions, the overlapping area between the drain electrode and the gate electrode will not change. In other words, the capacitance of the gate-drain capacitor will not change, and thus, the display quality will be improved. These and other objectives of the present invention will no doubt become obvious to those of ordinary skill in the art after reading the following detailed description of the preferred embodiment that is illustrated in the various figures and drawings.

DETAILED DESCRIPTION

The present invention has been described using exemplary preferred embodiments and their corresponding drawings. However, it is to be understood that the scope of the invention is not limited to the disclosed embodiments and drawings. For example, the proposed components, quantities, shapes, relative angles, relative distances, relative positions of the TFT or TFT array are not intended to limit the scope of the present invention. On the contrary, they are intended to include various modifications and equivalent arrangements included within the spirit and scope of the appended claims. The exemplary preferred embodiments are independent to each other unless its coexistence is explicitly stated.

Figure 1:
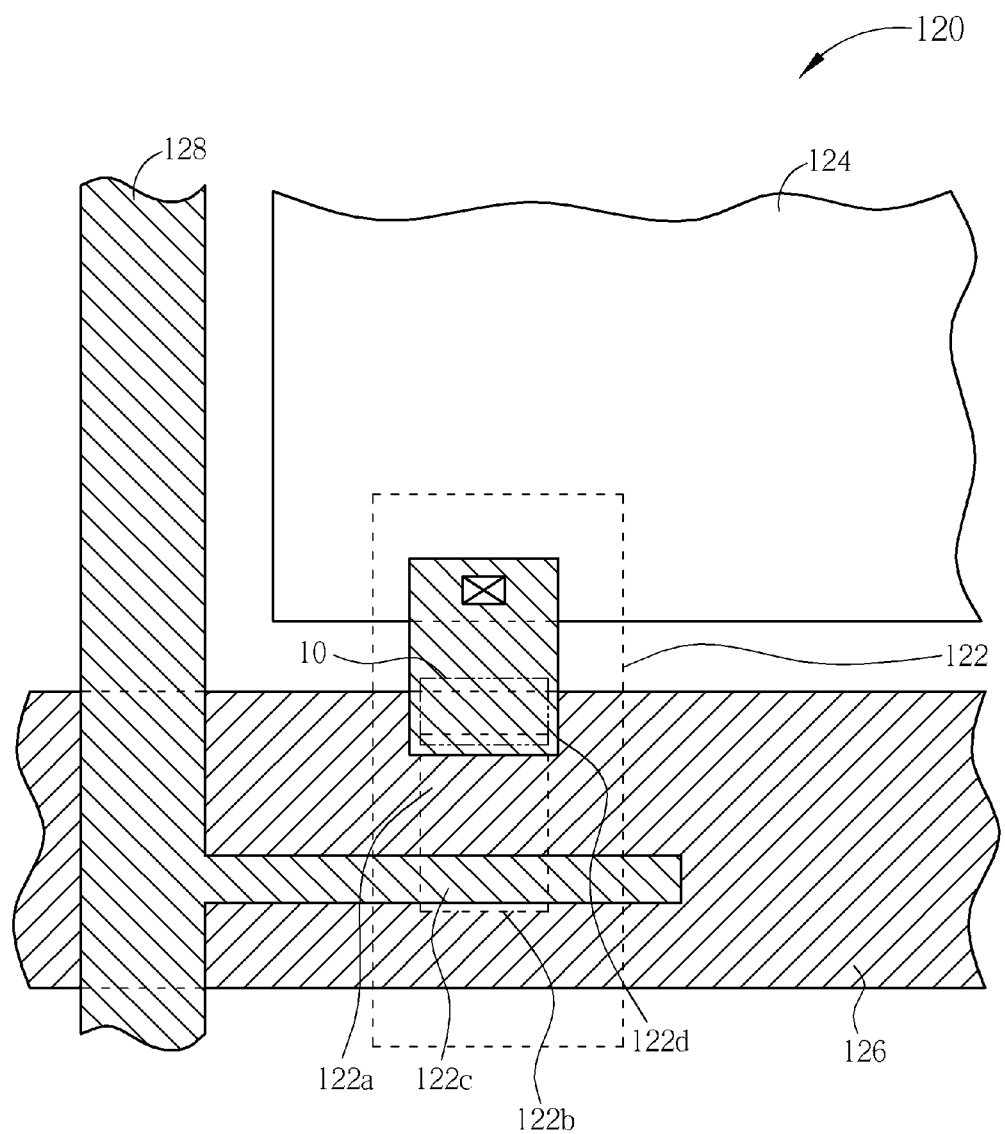
FIG. 1 is a regional schematic diagram showing a conventional pixel structure.
Figure 2:
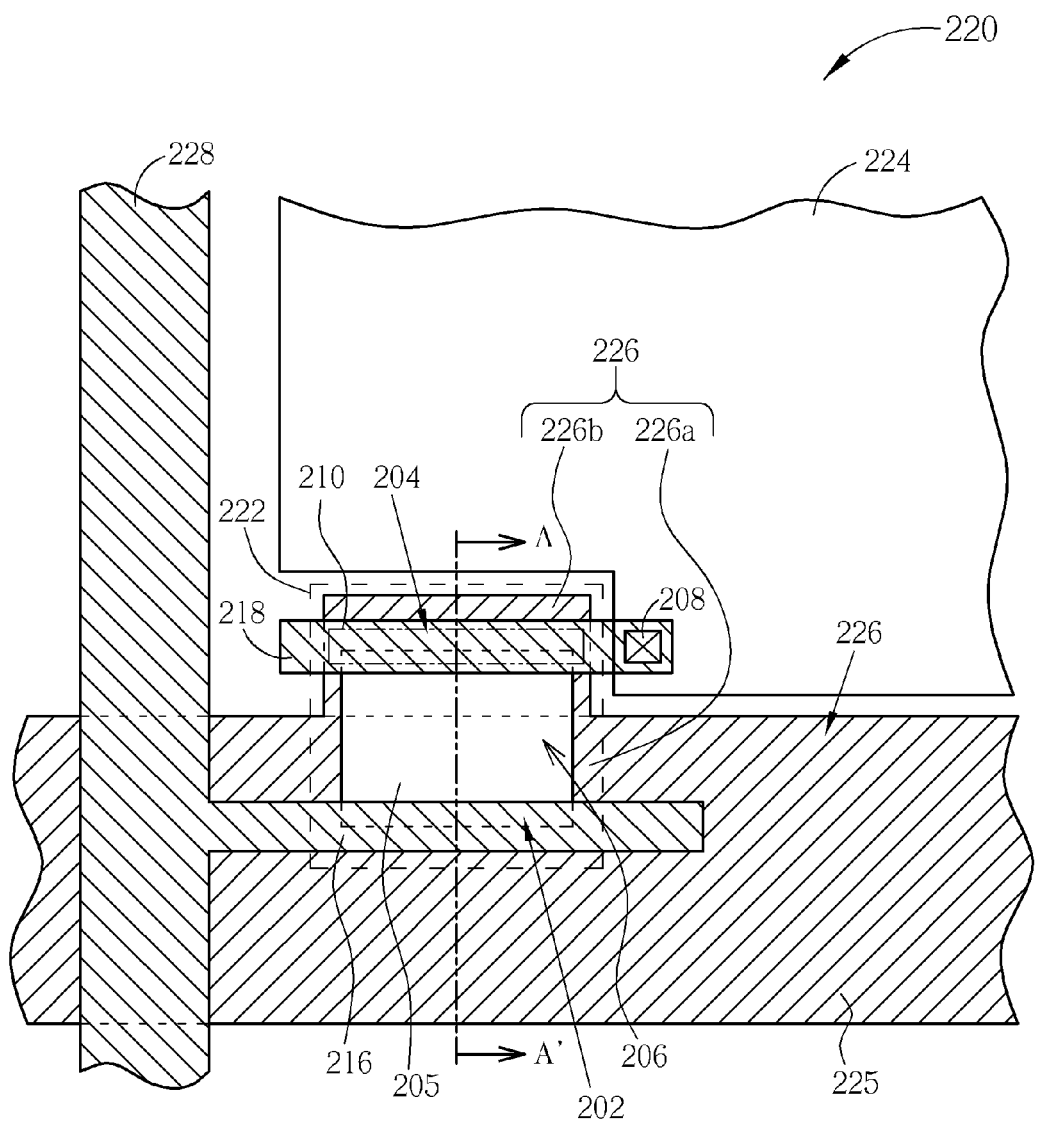
FIG. 2 is a regional schematic diagram showing a pixel structure according to a first preferred embodiment of the present invention.
Figure 3:
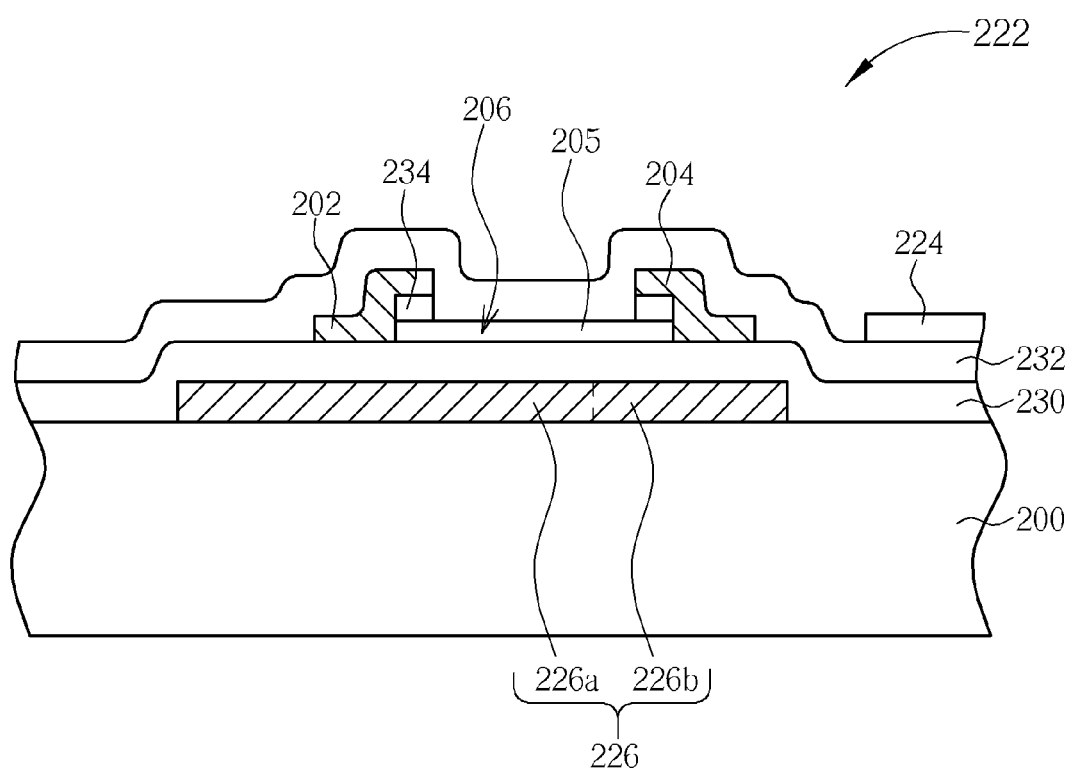
FIG. 3 is a cross-sectional schematic diagram across A to A' of FIG. 2.

FIG. 2 is a regional schematic diagram showing a pixel structure according to a first preferred embodiment of the present invention. FIG. 3 is a cross-sectional schematic diagram across A to A' of FIG. 2. It is to be noted that the same symbols are used to denote portions or all of the same components. All the drawings in the present invention only illustrate a single pixel structure; however, the present invention may contain a pixel array including a plurality of pixels, which can be applied to a variety of display devices, such as LCDs. Additionally, in order to clearly illustrate the layout pattern of a pixel structure, FIG. 2 shows the structure in a perspective view. However, the structure does not have to be made of transparent materials. Referring to FIG. 2 along with FIG. 3, a pixel structure 220 of the present invention primarily includes a TFT 222, a pixel electrode 224, a scan line 225, and a data line 228. More specifically, the TFT 222 contains a source electrode 202, a drain electrode 204, a semiconductor layer 205, a gate electrode 226, a first dielectric layer 230, and a second dielectric layer 232. The TFT 222 is disposed on a substrate 200 and the drain electrode 204 of the TFT 222 is electrically connected to the pixel electrode 224. The source electrode 202 is electrically connected to the data line 228 and the gate electrode 226 is electrically connected to the scan line 225.

The substrate 200 may be a substrate made of any materials, and preferably a transparent substrate, such as a glass substrate or an acrylic substrate. The gate electrode 226 is disposed above the substrate 200 and the position of the gate electrode 226 is beneath the semiconductor layer 205. In terms of the layout pattern, the gate electrode 226 has a bar-shaped main part 226a and a protrusion part 226b, and the bar-shaped main part 226a of each of the pixel structures 220 in the same row may be serially connected to each other to form a scan line 225. As a result, the patterns of the bar-shaped main part 226a and the protrusion part 226b can be formed altogether with the scan line 225 via the same material layer and the same patterning manufacturing process, which requires no additional process.

The first dielectric layer 230 is made of an electrically-insulating material, such as silicon nitride, silicon oxide, or silicon oxynitride. Moreover, the first dielectric layer 230 may cover the gate electrode 226 for use as a gate dielectric layer. The semiconductor layer 205 is disposed on the first dielectric layer 230 above the gate electrode 226. The semiconductor layer 205 can be made of materials such as amorphous silicon or polycrystalline silicon. When amorphous silicon is selected for the semiconductor layer 205, a channel of the TFT 222 can be an undoped intrinsic semiconductor layer. On the other hand, when the semiconductor layer 205 is made of polycrystalline silicon, a part or an entire of the semiconductor layer 205 can be doped with P-type dopant or N-type dopant to form a channel region 206 therein. In the present embodiment, the entire channel region 206 covers the gate electrode 226; the bar-shaped main part 226a and the protrusion part 226b of the gate electrode 226 are completely covered by the channel region 206. That is, the channel region 206 is fully covered by the bar-shaped main part 226a and the protrusion part 226b of the gate electrode 226 in a bottom view. In order to lower the impedance of a semiconductor layer 205, an ohmic contact layer 234 may be formed above the semiconductor layer 205 as a contact interface layer between the semiconductor layer 205 and the source electrode 202; between the semiconductor layer 205 and the drain electrode 204 so that its interface resistance will be reduced.

The source electrode 202 and the drain electrode 204 are disposed above the semiconductor layer 205 and the ohmic contact layer 234. The source electrode 202 and the drain electrode 204 maybe made of any conductive materials, such as metals or transparent conductive materials. In the present embodiment, for instance, the source electrode 202 may only contain a first electrode bar 216, and the drain electrode 204 may only contain a second electrode bar 218. The second electrode bar 218 is, but not limited to being, substantially parallel to the first electrode bar 216. The first electrode bar 216 and the second electrode bar 218 are located at two opposing sides of the channel region 206; that is, the channel region 206 is formed between the first electrode bar 216 and the second electrode bar 218. The data line 228 is also disposed above the first dielectric layer 230, and the data line 228 is, but not limited to being, substantially perpendicular to, the first electrode bar 216. In addition, the data line 228 is in contact with and electrically connected to the first electrode bar 216 of the source electrode 202. The data line 228, the source electrode 202, and the drain electrode 204 can be formed by the same material layer and in the same patterning manufacturing process, wherein the first electrode bar 216 of the source electrode 202 may extend to a position above the gate electrode 226.

The first electrode bar 216 and the second electrode bar 218 are substantially parallel to the bar-shaped main part 226a. The second electrode bar 218 can be disposed over the gate electrode 226 and partially overlap with the gate electrode 226 via the protrusion part 226b. Especially in the present embodiment, the second electrode bar 218 can be designed to be disposed over one protrusion part 226b of the gate electrode 226. As a result, two opposing ends of the second electrode bar 218 will not overlap with the gate electrode 226 in a vertical direction, and the area where the second electrode bar 218 and the gate electrode 226 overlap with each other forms a capacitor 210. In other words, the source electrode 202 and the drain electrode 204 are disposed above the ohmic contact layer 234, and the drain electrode 204 is disposed above the protrusion part 226b, i.e. on the first dielectric layer 230. Moreover, the shape of the drain electrode 204 may be a stripped rectangle in one embodiment of the present invention, and the area where the gate electrode 226 and the drain electrode 204 overlap with each other in a vertical direction forms a capacitor 210, which causes a gate-drain capacitance effect.

The source electrode 202, the drain electrode 204, and the data line 228 may be covered by the second dielectric layer 232, and the pixel electrode 224 can be disposed above the second dielectric layer 232. The second dielectric layer 232 maybe made of silicon nitride, silicon oxide, or silicon oxynitride. Additionally, the pixel electrode 224 is in contact with and electrically connected to an end of the second electrode bar 218 through a contact via 208, which could be an opening of the second dielectric layer 232 in practical use.

Since the drain electrode 204 is disposed over the protrusion part 226b of the gate electrode 226 and extends outwardly, the protrusion part 226b will stride across the second electrode bar 218 of the drain electrode 204 and extend outwardly, and two opposing ends of the second electrode bar 218 will not overlap with the gate electrode 226 in a vertical direction. Therefore, even if the layout between the gate electrode 226 and the drain electrode 204 is misaligned in a perpendicular direction or in a horizontal direction due to some errors in mask alignment or machinery vibration, the area of the capacitor 210 will not change. In other words, the capacitance of the gate-drain capacitor will remain unchanged, and thus, the pixel feed-through voltage will be steady to ensure the TFT display quality. Furthermore, the bar-shaped main part 226a of the gate electrode 226 is covered by the entire channel region 206, so the whole channel region 206 can serve as a channel of the TFT 222 when functioned. Therefore, a preferred layout of the TFT 222 is provided.

It is to be noted that in the first embodiment and drawings, the rectangular protrusion part 226b, the stripped rectangular drain electrode 204, and the stripped rectangular source electrode 202 are illustrated as examples of the present invention, but not to be interpreted as limiting the shapes of the gate electrode 226, the drain electrode 204, and the source electrode 202. That is, the shapes of the gate electrode 226, the drain electrode 204, and the source electrode 202 may include other types; for instance, the protrusion part 226b may be of a round shape, a polygonal shape, and so on. The gate electrode 226 may further contain an indention part, and the drain electrode 204 can be of a certain shape, such as the square shape.

Figure 4:
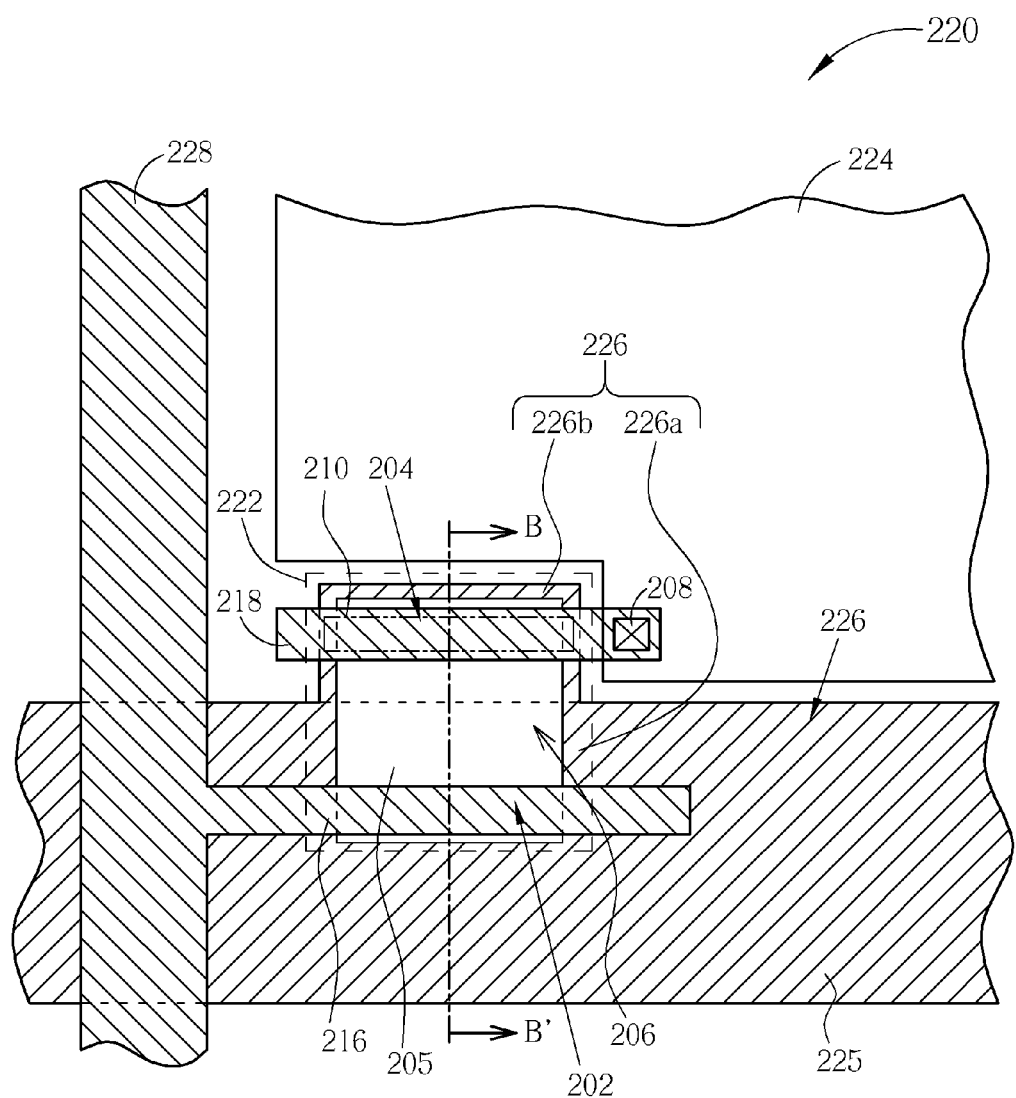
FIG. 4 is a regional schematic diagram showing a pixel structure according to a second preferred embodiment of the present invention.
Figure 5:
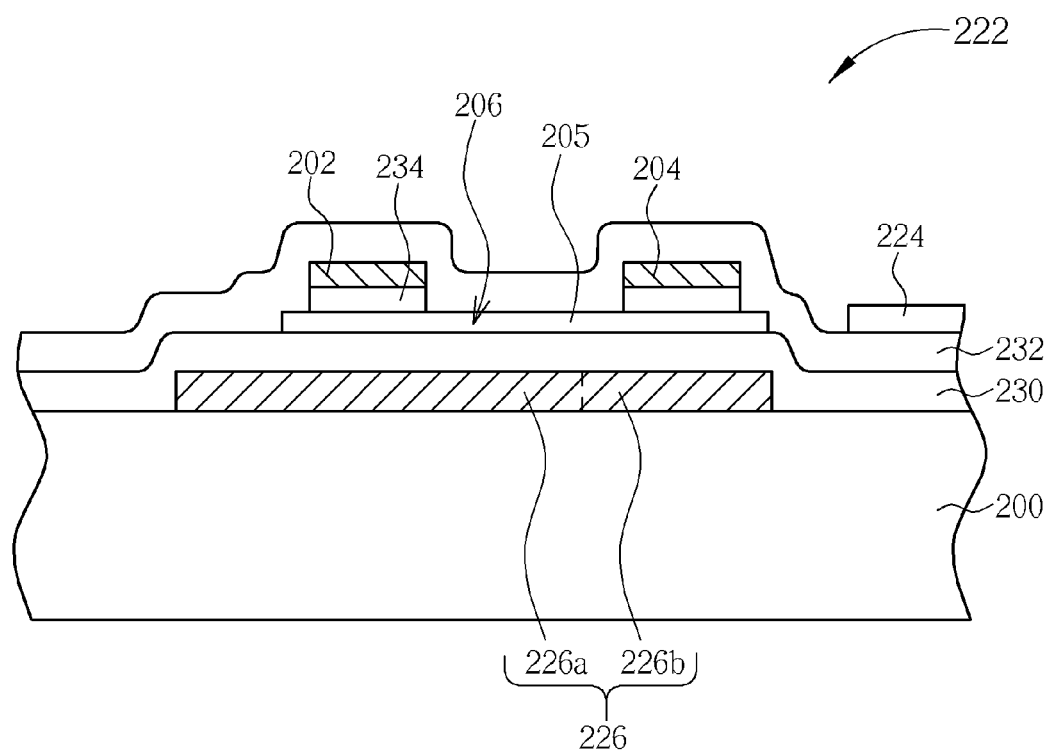
FIG. 5 is a cross-sectional schematic diagram across B to B' of FIG. 4.

Referring to FIGS. 4 and 5, FIG. 4 is a regional schematic diagram showing a pixel structure according to a second preferred embodiment of the present invention and FIG. 5 is a cross-sectional schematic diagram across B to B' of FIG. 4. In order to compare the present embodiment with the first preferred embodiment, these two embodiments adopt the same component reference numerals and symbols. As shown in FIG. 4 and FIG. 5, the difference between the present embodiment and the first preferred embodiment lies in that the semiconductor layer 205 extends more upwardly and more downwardly. Therefore, the semiconductor layer 205 is longer than a distance between the first electrode bar 216 and the second electrode bar 218 in a vertical direction from a top view. Even if the first electrode bar 216 or the second electrode bar 218 is misaligned due to some errors in mask alignment or machinery vibration, the overlapping areas formed by either the first electrode bar 216 and the semiconductor layer 205 or the second electrode bar 218 and the semiconductor layer 205 will not change. Since the semiconductor layer 205 serves as a capacitor dielectric layer in the present embodiment, the design will keep stable the capacitance of the gate-drain capacitor.

Figure 6:
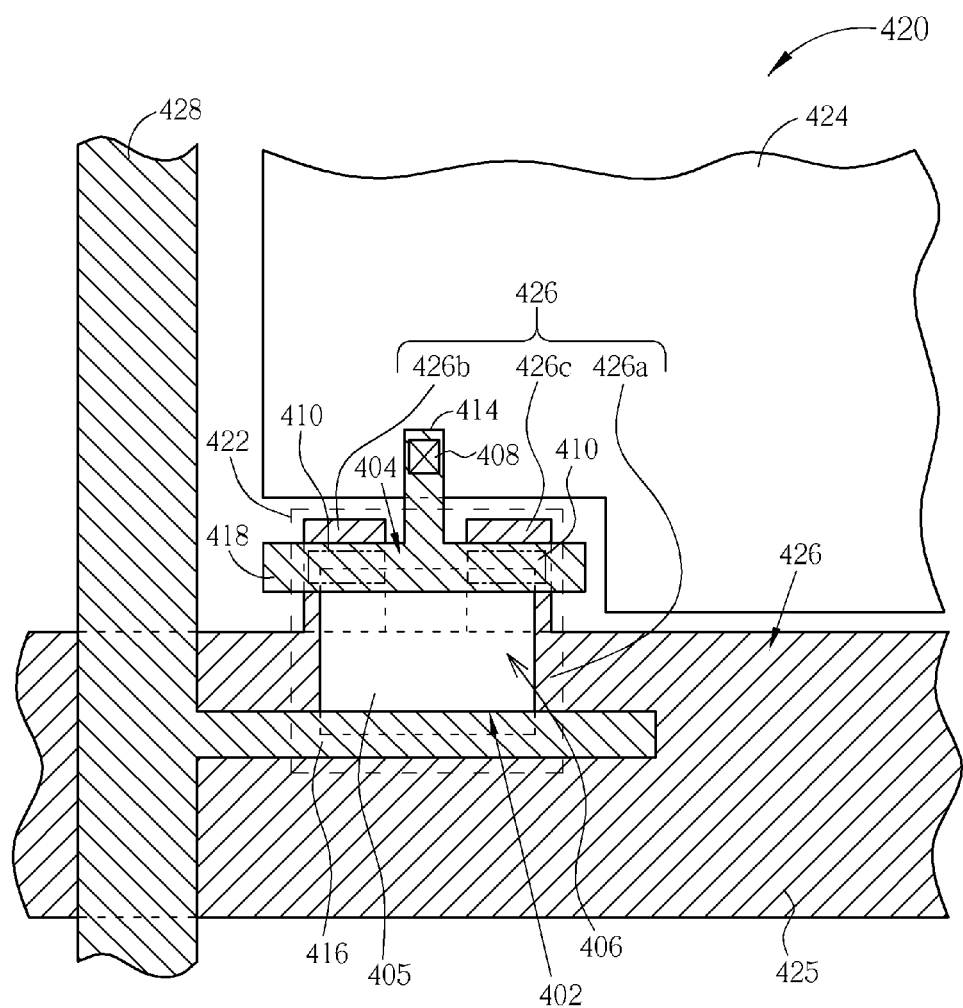
FIG. 6 is a regional schematic diagram showing a pixel structure according to a third preferred embodiment of the present invention.

FIG. 6 is a regional schematic diagram showing a pixel structure according to a third preferred embodiment of the present invention. As shown in FIG. 6, a pixel structure 420 mainly contains a TFT 422, a pixel electrode 424, a scan line 425, and a data line 428. The TFT 422 includes a source electrode 402, a drain electrode 404, a gate electrode 426, and a semiconductor layer 405. The semiconductor layer 405 includes a channel region 406, and the TFT 422 may include a first dielectric layer and a second dielectric layer as described in the previous embodiment (not shown in FIG. 6). The source electrode 402 may contain a first electrode bar 416 and the drain electrode 404 may contain a second electrode bar 418. To highlight the characteristics in the present embodiment, descriptions of component layouts, material dispositions bearing similarities among all of the embodiments haven been omitted.

One of the major differences between the present embodiment and the first embodiment lies in that the gate electrode 426 has one bar-shaped main part 426a and two protrusion parts 426b and 426c in the second embodiment. The second electrode bar 418 will be disposed over the two protrusion parts 426b, 426c of the gate electrode 426 so that the two opposing ends of the second electrode bar 418 will not overlap with the gate electrode 426 in a vertical direction. Therefore, there are two areas that the second electrode bar 418 and the gate electrode 426 overlap with each other and each of the areas forms a capacitor 410 respectively. In the present embodiment, only a part of the channel region 406 may cover the bar-shaped main part 426a and the two protrusion parts 426b, 426c of the gate electrode 426. In other words, a part of the channel region 406 is not covered by the gate electrode 426 in a bottom view.

Another difference between the present embodiment and the first embodiment lies in that the drain electrode 404 may further include a third electrode bar 414 perpendicular to the second electrode bar 418 and disposed between the two protrusion parts 426b and 426c. One end of the third electrode bar 414 is connected to the second electrode bar 418, and the pixel electrode 424 is in contact with and electrically connected to the other end of the third electrode bar 414 through a contact via 408. Accordingly, the second electrode bar 418 and the third electrode bar 414 of the drain electrode 404 form a T shape, and two opposing ends of the second electrode bar 418 will have higher consistent electrical properties. Since the second electrode bar 418 is electrically connected to the pixel electrode 424 via the third electrode bar 414, the second electrode bar 418 itself may be, but not limited to being, not in contact with the pixel electrode 424 in the present embodiment.

As the drain electrode 404 is disposed over the gate electrode 426 to extend outwardly, the two protrusion parts 426b, 426c will be disposed over the second electrode bar 418 to extend outwardly accordingly. In addition, the two opposing ends of the second electrode bar 418 will not overlap with the gate electrode 426 in a vertical direction. As a result, even if the layout between the drain electrode 204 and the gate electrode 226 is slightly misaligned in a vertical direction or in a horizontal direction, the areas and the positions of the two capacitors 410 will not change.

Figure 7:
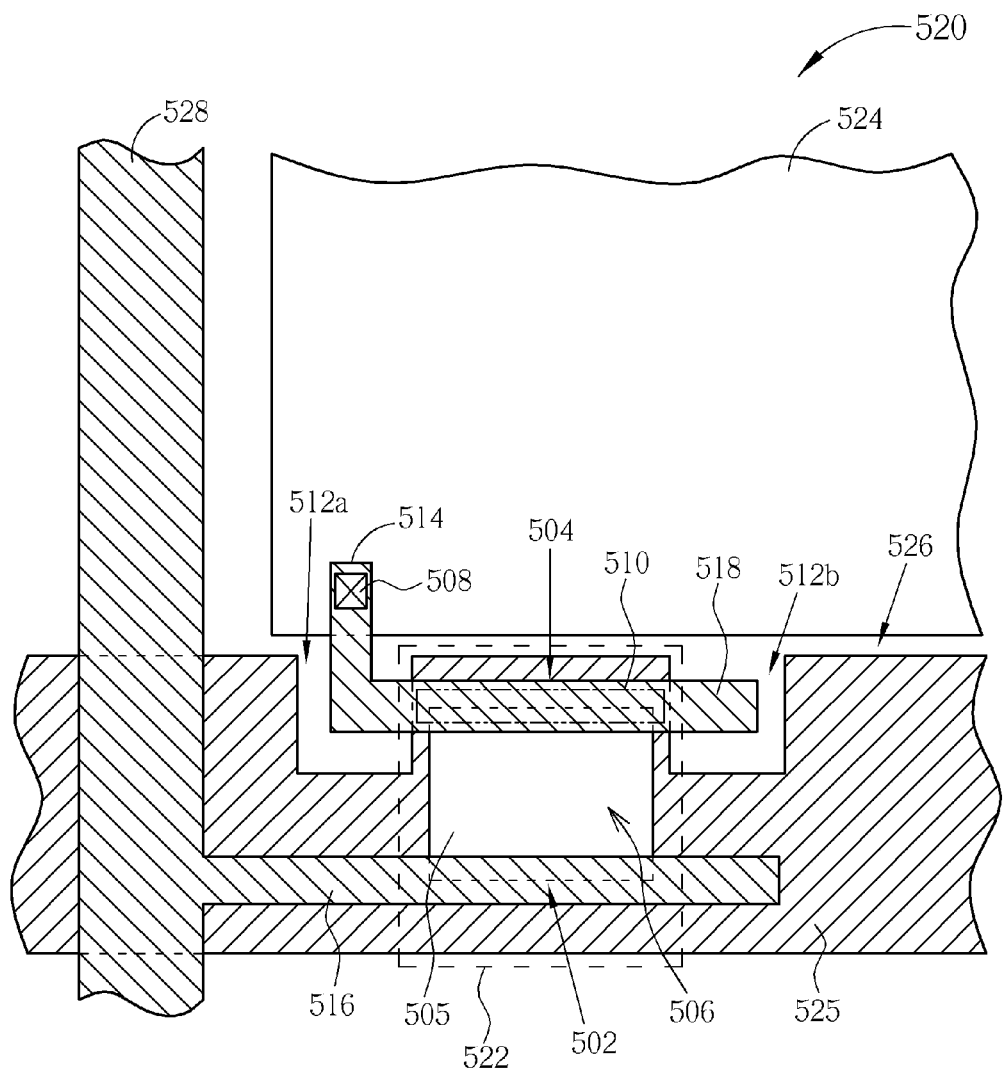
FIG. 7 is a regional schematic diagram showing a pixel structure according to a fourth preferred embodiment of the present invention.

FIG. 7 is a regional schematic diagram showing a pixel structure according to a fourth preferred embodiment of the present invention. As shown in FIG. 7, a pixel structure 520 of the present invention mainly includes a TFT 522, a pixel electrode 524, a scan line 525, and a data line 528. The TFT 522 contains a source electrode 502, a drain electrode 504, a gate electrode 526, and a semiconductor layer 505. Moreover, the semiconductor layer 505 may contain a channel region 506, the source electrode 502 may contain a first electrode bar 516, and the drain electrode 504 may contain a second electrode bar 518.

One of the major differences between the present embodiment and the first, the second preferred embodiments lies in that the gate electrode 526 has a bar-shaped main part 526a and two indention parts 512a, 512b, and two opposing ends of the second electrode bar 518 are disposed corresponding to positions of the two indention parts 512a, 512b of the gate electrode 526 respectively. Therefore, an area that the second electrode bar 518 and the gate electrode 526 overlap with each other will form a capacitor 510. In the present embodiment, the entire channel region 506 covers the bar-shaped main part 526a of the gate electrode 526. That is, the channel region 506 is completely covered by the bar-shaped main part 526a of the gate electrode 526 in a bottom view. Since the entire channel region 506 covers the bar-shaped main part 526a of the gate electrode 526, the whole channel region 506 can serve as a channel of the TFT 522 functionally. Therefore, a preferred layout of the TFT 522 is provided.

Another difference between the present embodiment and the first embodiment lies in that the drain electrode 504 further includes a third electrode bar 514. The third electrode bar 514 is perpendicular to the second electrode bar 518 and disposed corresponding to a position of one of the indention parts 512a and 512b. As shown in FIG. 7, for example, the third electrode bar 514 is disposed corresponding to the indention part 512a. One end of the third electrode bar 514 is connected to the second electrode bar 518, and the pixel electrode 524 is electrically connected to the other end of the third electrode bar 514 through a contact via 508. Accordingly, the second electrode bar 518 of the drain electrode 504 and the third electrode bar 514 form an L shape, and the area of the pixel electrode 524 will be increased. That is, an aperture ratio of the pixel structure 520 in the present embodiment may be higher.

Figure 8:
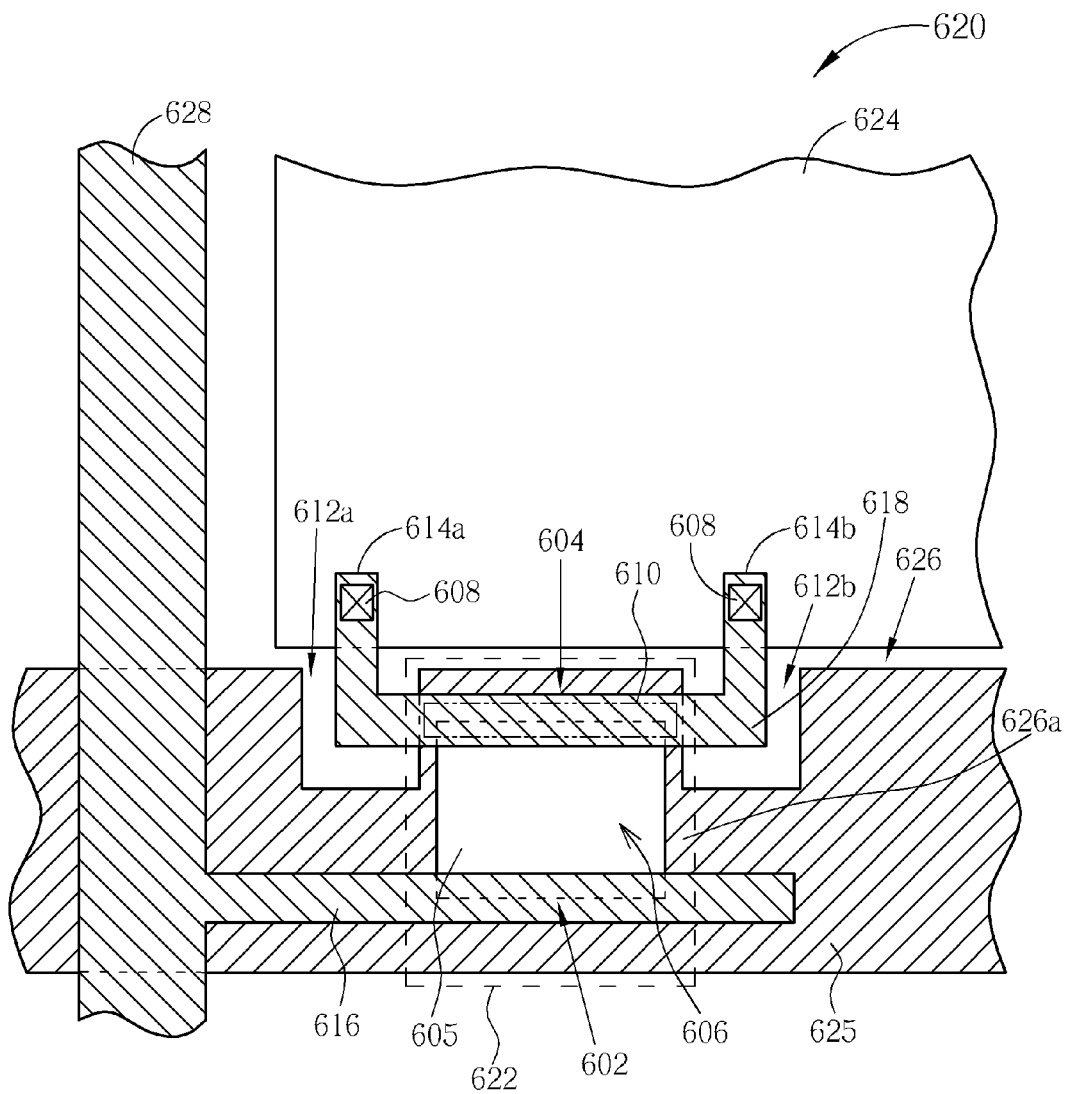
FIG. 8 is a regional schematic diagram showing a pixel structure according to a fifth preferred embodiment of the present invention.

FIG. 8 is a regional schematic diagram showing a pixel structure according to a fifth preferred embodiment of the present invention. As shown in FIG. 8, a pixel structure 620 of the present invention mainly includes a TFT 622, a pixel electrode 624, a scan line 625, and a data line 628. The TFT 622 contains a source electrode 602, a drain electrode 604, a gate electrode 626, and a semiconductor layer 605. The semiconductor layer 605 contains a channel region 606, the source electrode 602 may include a first electrode bar 616, and the drain electrode 604 may include a second electrode bar 618. The gate electrode 626 has a bar-shaped main part 626a and two indention parts 612a and 612b. An area that the second electrode bar 618 and the gate electrode 626 overlap with each other forms a capacitor 610.

One of the major differences between the present embodiment and the third preferred embodiment lies in that the drain electrode 604 further includes a fourth electrode bar 614b. Both of the third and the fourth electrode bars 614a, 614b are perpendicular to the second electrode bar 618. In addition, the third electrode bar 614a and the fourth electrode bar 614b are disposed corresponding to positions of the indention part 612a and the indention part 612b respectively. One end of the third electrode bar 614a and one end of the fourth electrode bar 614b are respectively connected to two opposing ends of the second electrode bar 618, and the pixel electrode 624 is electrically connected to the other end of the third electrode bar 614a and the other end of the fourth electrode bar 614b through two contact vias 608 respectively. Accordingly, an aperture ratio of the pixel structure 620 in the present embodiment is increased and the connection between the drain electrode 604 and the pixel electrode 624 will be more stable. The electrical connection between the drain electrode 604 and the pixel electrode 624 will be more reliable as well. Furthermore, the whole channel region 606 covers the gate electrode 626 to serve as a channel of the TFT 622 functionally. Therefore, a preferred layout of the TFT 622 is provided.

Figure 9:
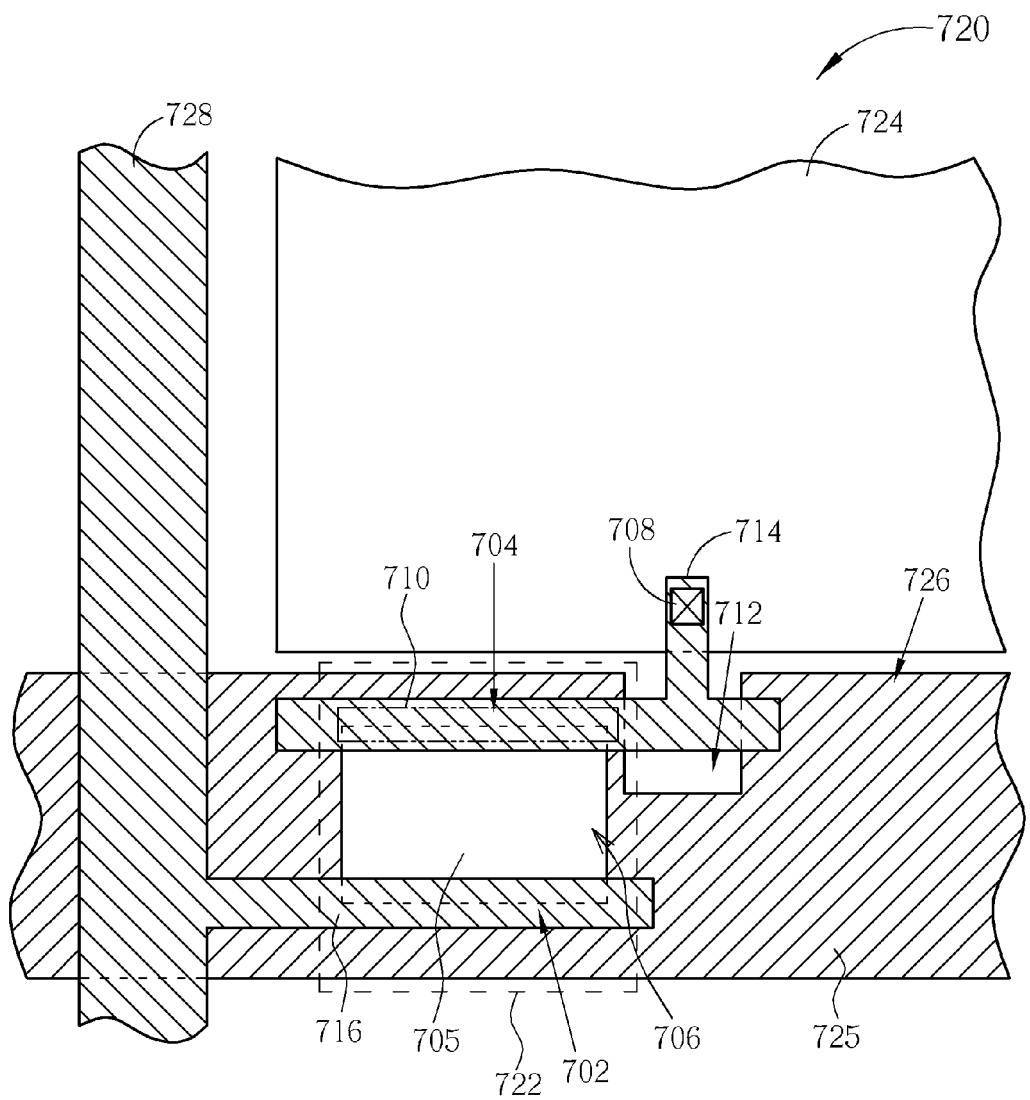
FIG. 9 is a regional schematic diagram showing a pixel structure according to a sixth preferred embodiment of the present invention.

Referring to FIG. 9, it is a regional schematic diagram showing a pixel structure according to a sixth preferred embodiment of the present invention. As shown in FIG. 9, a pixel structure 720 of the present invention mainly includes a TFT 722, a pixel electrode 724, a scan line 725, and a data line 728. The TFT 722 contains a source electrode 702, a drain electrode 704, a gate electrode 726, and a semiconductor layer 705. The semiconductor layer 705 may contain a channel region 706, the source electrode 702 may contain a first electrode bar 716, and the drain electrode 704 may contain a second electrode bar 718.

One of the major differences between the present embodiment and the previously-described preferred embodiments lies in that the gate electrode 726 has only one bar-shaped main part 726a and one indention part 712. The second electrode bar 718 strides across the indention part 712 so that two opposing ends of the second electrode bar 718 both overlap with the gate electrode 726 in a vertical direction. An area that the second electrode bar 718 and the gate electrode 726 overlap with each other forms a capacitor 710. The drain electrode 704 further includes a third electrode bar 714 perpendicular to the second electrode bar 718 and disposed corresponding to a position of the indention part 712. One end of the third electrode bar 714 is connected to the second electrode bar 718, and the pixel electrode 724 is electrically connected to the other end of the third electrode bar 714 through a contact via 708. Accordingly, an aperture ratio of the pixel structure 720 in the present embodiment will be increased. Moreover, since the entire channel region 706 covers the bar-shaped main part 726a of the gate electrode 726, the whole channel region 706 can serve as a channel of the TFT 722 functionally. Therefore, a preferred layout of the TFT 722 is provided.

In summary, at least the following advantages of the pixel structure are provided in the present invention. First, even if the layout between the gate electrode and the drain electrode is slightly misaligned in a vertical direction or in a horizontal direction, either the area or the position of the gate-drain capacitor will not change so that a TFT display quality will be improved. Second, a data line, a source electrode, and a drain electrode can be formed simultaneously via the same material layer and the same patterning manufacturing process and patterns of a scan line, a bar-shaped main part, and a protrusion part can be formed simultaneously by simply modifying the layout pattern. Thus, no additional process is required. Third, in some of the embodiments mentioned above, the entire channel region covers the bar-shaped main part of the gate electrode so that the entire channel region can serve as a channel of the TFT functionally.

Those skilled in the art will readily observe that numerous modifications and alterations of the device and method may be made while retaining the teachings of the invention.

What is claimed is:

1. A pixel structure having capacitor compensation, comprising:
    a thin film transistor (TFT), comprising:
        a source electrode, comprising a first electrode bar;
        a drain electrode, comprising a second electrode bar, wherein the second electrode bar is substantially parallel to the first electrode bar;
        a semiconductor layer disposed under the source electrode and the drain electrode, the semiconductor layer comprising a channel region, wherein the channel region is disposed between the first electrode bar and the second electrode bar; and
        a gate electrode disposed under the semiconductor layer, the gate electrode having a bar-shaped main part, and at least two indention parts, wherein the bar-shaped main part is parallel to the first electrode bar and the second electrode bar, and the bar-shaped main part is covered by the channel region;

wherein via the at least two indention parts, the second electrode bar is disposed over the gate electrode and partially overlaps with the gate electrode, two ends of the second electrode bar do not overlap with the gate electrode in a vertical direction, and an area where the second electrode bar and the gate electrode overlap with each other forms a capacitor; and wherein the drain electrode further comprises a third electrode bar and a fourth electrode bar, both of the third electrode bar and the fourth electrode bar are perpendicular to the second electrode bar, the third electrode bar and the fourth electrode bar are disposed corresponding to positions of the two indention parts respectively, and wherein one end of the third electrode bar and one end of the fourth electrode bar are connected to the second electrode bar individually, and the pixel electrode is electrically connected to the other end of the third electrode bar and the other end of the fourth electrode through two contact vias respectively.

2. The pixel structure having capacitor compensation of claim 1, further comprising a data line, the data line being substantially perpendicular to the first electrode bar and connected to the first electrode bar.

3. The pixel structure having capacitor compensation of claim 2, further comprising a pixel electrode, the pixel electrode being electrically connected to the second electrode bar.

4. The pixel structure having capacitor compensation of claim 3, wherein the second electrode bar is disposed over only one protrusion part of the gate electrode.

5. The pixel structure having capacitor compensation of claim 4, wherein the entire channel region covers the gate electrode, and the bar-shaped main part and the protrusion part are both covered by the channel region.

6. The pixel structure having capacitor compensation of claim 5, wherein the pixel electrode is electrically connected to one end of the second electrode bar through a contact via.

7. The pixel structure having capacitor compensation of claim 3, wherein the second electrode bar is disposed over two protrusion parts of the gate electrode.

8. The pixel structure having capacitor compensation of claim 7, wherein the channel region covers the two protrusion parts of the gate electrode.

9. The pixel structure having capacitor compensation of claim 8, wherein the drain electrode further comprises a third electrode bar perpendicular to the second electrode bar and disposed between the two protrusion parts, one end of the third electrode bar is connected to the second electrode bar, and the other end of the third electrode bar is electrically connected to the pixel electrode through a contact via.

10. The pixel structure having capacitor compensation of claim 3, wherein the two ends of the second electrode bar are disposed corresponding to positions of the two indention parts respectively.

11. The pixel structure having capacitor compensation of claim 10, wherein the entire channel region covers the bar-shaped main part of the gate electrode.

12. The pixel structure having capacitor compensation of claim 11, wherein the drain electrode further comprises a third electrode bar perpendicular to the second electrode bar and disposed corresponding to a position of one of the two indention parts, one end of the third electrode bar is connected to the second electrode bar, and the other end of third electrode bar is electrically connected to the pixel electrode through a contact via.

13. A pixel structure having capacitor compensation, comprising:
a thin film transistor (TFT), comprising:
a source electrode, comprising a first electrode bar;
a drain electrode, comprising a second electrode bar, wherein the second electrode bar is substantially parallel to the first electrode bar;
a semiconductor layer disposed under the source electrode and the drain electrode, the semiconductor layer comprising a channel region, wherein the channel region is disposed between the first electrode bar and the second electrode bar; and
a gate electrode disposed under the semiconductor layer, the gate electrode having a bar-shaped main part, and at least two indention parts, wherein the bar-shaped main part is parallel to the first electrode bar and the second electrode bar, the bar-shaped main part is covered by the channel region, and the two ends of the second electrode bar are disposed corresponding to positions of the two indention parts respectively;
a data line substantially perpendicular to the first electrode bar and connected to the first electrode bar; and
a pixel electrode electrically connected to the second electrode bar;
wherein via the at least two indention parts, the second electrode bar is disposed over the gate electrode and partially overlaps with the gate electrode, two ends of the second electrode bar do not overlap with the gate electrode in a vertical direction, and an area where the second electrode bar and the gate electrode overlap with each other forms a capacitor; and wherein the drain electrode further comprises a third electrode bar and a fourth electrode bar, both of the third electrode bar and the fourth electrode bar are perpendicular to the second electrode bar, the third electrode bar and the fourth electrode bar are disposed corresponding to positions of the two indention parts respectively, and wherein one end of the third electrode bar and one end of the fourth electrode bar are connected to the second electrode bar individually, and the pixel electrode is electrically connected to the other end of the third electrode bar and the other end of the fourth electrode through two contact vias respectively.

14. A pixel structure having capacitor compensation, comprising:
a thin film transistor (TFT), comprising:
a source electrode, comprising a first electrode bar;
a drain electrode, comprising a second electrode bar, wherein the second electrode bar is substantially parallel to the first electrode bar;
a semiconductor layer disposed under the source electrode and the drain electrode, the semiconductor layer comprising a channel region, wherein the channel region is disposed between the first electrode bar and the second electrode bar;
a gate electrode disposed under the semiconductor layer, the gate electrode having a bar-shaped main part, and at least two indention parts, wherein the bar-shaped main part is parallel to the first electrode bar and the second electrode bar, the entire channel region covers the bar-shaped main part of the gate electrode, and the two ends of the second electrode bar are disposed corresponding to positions of the two indention parts respectively;
a data line substantially perpendicular to the first electrode bar and connected to the first electrode bar; and
a pixel electrode electrically connected to the second electrode bar;
wherein via the at least two indention parts, the second electrode bar is disposed over the gate electrode and partially overlaps with the gate electrode, two ends of the second electrode bar do not overlap with the gate electrode in a vertical direction, and an area where the second electrode bar and the gate electrode overlap with each other forms a capacitor; and wherein the drain electrode further comprises a third electrode bar and a fourth electrode bar, both of the third electrode bar and the fourth electrode bar are perpendicular to the second electrode bar, the third electrode bar and the fourth electrode bar are disposed corresponding to positions of the two indention parts respectively, and wherein one end of the third electrode bar and one end of the fourth electrode bar are connected to the second electrode bar individually, and the pixel electrode is electrically connected to the other end of the third electrode bar and the other end of the fourth electrode through two contact vias respectively.

* * * * *